United States Patent
Shen et al.

(10) Patent No.: US 12,028,606 B2
(45) Date of Patent: Jul. 2, 2024

(54) SYSTEM FOR REMOTELY CONTROLLING MICROSCOPIC MACHINERY AND METHOD THEREOF

(71) Applicant: V5 TECHNOLOGIES CO., LTD., Hsinchu (TW)

(72) Inventors: Tzu-Kuei Shen, Hsinchu (TW); Kuo-Tung Hung, Hsinchu (TW); Guang-Hao Suen, Hsinchu (TW); Liang-Wei Sheu, Hsinchu (TW)

(73) Assignee: V5MED INC., Zhubei (TW)

( * ) Notice: Subject to any disclaimer, the term of this patent is extended or adjusted under 35 U.S.C. 154(b) by 112 days.

(21) Appl. No.: 17/987,014

(22) Filed: Nov. 15, 2022

(65) Prior Publication Data

US 2024/0114239 A1   Apr. 4, 2024

(30) Foreign Application Priority Data

Oct. 4, 2022   (TW) ................... 111137682

(51) Int. Cl.
*H01J 37/20*   (2006.01)
*H04N 7/18*   (2006.01)
(Continued)

(52) U.S. Cl.
CPC ........... *H04N 23/661* (2023.01); *H01J 37/20* (2013.01); *H04N 7/183* (2013.01); *H04N 23/54* (2023.01); *H04N 23/695* (2023.01)

(58) Field of Classification Search
CPC ....... H01J 37/20; H04N 23/54; H04N 23/661; H04N 23/695; H04N 7/183
(Continued)

(56) References Cited

U.S. PATENT DOCUMENTS

| 2010/0208052 A1* | 8/2010 | Sase ..................... G02B 21/365 348/79 |
| 2011/0228071 A1* | 9/2011 | Rohde ..................... H04N 7/18 348/79 |

(Continued)

FOREIGN PATENT DOCUMENTS

| TW | I251788 B | 3/2006 |
| TW | 201118662 A | 6/2011 |

(Continued)

OTHER PUBLICATIONS

ETH, "[Original Photo Sharing] No compression, no space limit to transfer photos! Line/Telegram," https://kikinote.net, Sep. 16, 2022, with English translation.

*Primary Examiner* — Daquan Zhao
(74) *Attorney, Agent, or Firm* — Birch, Stewart, Kolasch & Birch, LLP

(57) ABSTRACT

A system for remotely controlling microscopic machinery and a method thereof are provided. The system includes at least one local device and a remote host for sending a control command thereto. A microslide is placed on a microscopic camera device in the local device, and the microscopic camera device captures an image of the microslide according to a capture command in the control command. The local device transmits the image to the remote host in a video format. A motorized stage moves to a next preset position according to a movement command in the control command to capture another image of the microslide. The steps of capturing and transmitting the image and the step of moving are repeated until the microslide is captured completely. The invention can solve the problem of time delay when the image captured by the remote control microscopic camera device is displayed.

14 Claims, 2 Drawing Sheets

(51) Int. Cl.
*H04N 23/54* (2023.01)
*H04N 23/661* (2023.01)
*H04N 23/695* (2023.01)

(58) Field of Classification Search
USPC ............................................. 348/79, 61, 73
See application file for complete search history.

(56) References Cited

U.S. PATENT DOCUMENTS

| | | | | |
|---|---|---|---|---|
| 2012/0082364 | A1* | 4/2012 | Tani | G06T 7/90 382/133 |
| 2018/0060993 | A1* | 3/2018 | Cheluvaraju | G06T 1/0007 |
| 2019/0313902 | A1* | 10/2019 | Charles | A61B 3/0025 |
| 2022/0021849 | A1* | 1/2022 | Xu | H04N 7/183 |

FOREIGN PATENT DOCUMENTS

| | | |
|---|---|---|
| TW | M463952 U | 10/2013 |
| TW | 201424294 A | 6/2014 |
| TW | I514324 B | 12/2015 |
| TW | I581634 B | 5/2017 |
| TW | 201722133 A | 6/2017 |
| TW | I598807 B | 9/2017 |
| TW | I630825 B | 7/2018 |
| TW | I640171 B | 11/2018 |
| TW | 201928983 A | 7/2019 |
| TW | I693564 B | 5/2020 |
| TW | I764687 B | 5/2022 |
| WO | WO 2019/000777 A1 | 1/2019 |

* cited by examiner

SYSTEM FOR REMOTELY CONTROLLING MICROSCOPIC MACHINERY AND METHOD THEREOF

This application claims priority of application Ser. No. 11/137,682 filed in Taiwan on 4 Oct. 2022 under 35 U.S.C. § 119; the entire contents of all of which are hereby incorporated by reference.

BACKGROUND OF THE INVENTION

Field of the Invention

The invention relates to a method for remotely controlling, in particular, to a system for remotely controlling microscopic machinery and a method thereof.

DESCRIPTION OF THE PRIOR ART

The laboratory and the data analysis center may be located in different places, or even the laboratory and the data analysis center may be different companies, because the laboratory equipment may require high-precision electron microscopes, sterile rooms, etc., while the data analysis centers may need high-speed computing hosts. Therefore, a subject can be entrusted to an external laboratory to do experiments, and then the data can be sent to the local data analysis center for analysis and research such as calculation processing.

At present, if the experiment is led by the data analysis center for remote control, the computer in the laboratory is generally operated by means of a remote desktop. For example, the computer in the data analysis center sends image capturing instructions to the laboratory computer, then the laboratory computer transmits the image capturing instruction to the electron microscope, and then the electron microscope then captures the image. However, the computer of the data analysis center and the laboratory computer are installed with remote desktop software, so that the image capturing instructions sent by the computer in the data analysis center are actually instructions for controlling the keyboard and mouse of the laboratory computer. Actually, the electron microscope still captures pictures according to the instruction of the laboratory computer, rather than the keyboard and mouse instructions sent by the computer in the data analysis center.

Further, at present, after the image capturing, typically multiple images are usually collected, compressed and then sent to a remote host. Assuming that the microscope captures 30 images per second, the original size of each image is 1 kb, and the size of the 30 images is 30 kb. The stream of 30 images can be reduced to 20 kb after being collected and compressed. However, this method will cause a time delay, so that the image displayed by the remote host is not the image just captured by the microscope.

In view of this, the invention provides a system for remotely controlling microscopic machinery and a method thereof in response to the above-mentioned deficiencies in the prior art and future needs, so as to solve the above deficiencies. The specific structure and the implementation thereof will be described in detail as below.

SUMMARY OF THE INVENTION

A main objective of the invention is to provide a system for remotely controlling microscopic machinery and a method thereof, which controls the microscopic camera device at the local end by sending instructions from the remote end, and when the image is transmitted back to the remote host for display, the problem of asynchronism between the displayed image and the captured image will not occur.

Another objective of the invention is to provide a system for remotely controlling microscopic machinery and a method thereof, so that the time delay is greatly reduced and the image displayed by the remote host and the captured image are the same through the method of sending a single image directly back to the remote host without compression.

Still another objective of the invention is to provide a system for remotely controlling microscopic machinery and a method thereof, wherein after the microscopic camera device captures an image, the motorized stage automatically moves to the next preset position; this moving process may just offset the time for the image to be transmitted back to the remote host, and make up for the delay caused by the image return, thereby solving the problem of asynchronism in the image display easily caused by remote control.

To achieve the above objectives, the invention provides a system for remotely controlling microscopic machinery. The system includes a remote host sending a control command that includes a movement command and a capture command, and at least one local device. Each of the at least one local device respectively includes a transceiver module receiving the control command sent by the remote host, a motorized stage electrically connected with the transceiver module to move according to the movement command of the control command, and a microscopic camera device disposed on the motorized stage and electrically connected with the transceiver module, a microslide is placed on the microscopic camera device, and the microscopic camera device captures an image of the microslide according to the capture command of the control command After the microscopic camera device captures the image of the microslide according to the capture command, the transceiver module transmits the image to the remote host in a video format, and the motorized stage moves to a next preset position according to the movement command to capture another image of the microslide.

According to an embodiment of the invention, the microscopic camera device includes a microscope and a camera, and the camera is mounted on a lens of the microscope.

According to an embodiment of the invention, the image is transmitted to the remote host without compression.

According to an embodiment of the invention, the local device includes a host, and the transceiver module is disposed in the host to transfer the control command to the microscopic camera device or the motorized stage through the host.

According to an embodiment of the invention, the local device includes a chip, the transceiver module is disposed in the chip and the chip is disposed on the microscopic camera device or the motorized stage to transfer the control command to the microscopic camera device or the motorized stage through the chip.

According to an embodiment of the invention, the motorized stage is pre-stored with a movement track to automatically move to the next preset position after the microscopic camera device captures the image.

According to an embodiment of the invention, the control command transmitted by the remote host further comprises a movement track, and the movement track is stored in the motorized stage after being received by the transceiver module, so that the motorized stage automatically moves to the next preset position after the microscopic camera device captures the image.

The invention further provides a method using for remotely controlling microscopic machinery. The method includes steps of: sending, by a remote host, a control command to at least one local device, wherein the control command comprises a capture command and a movement command, and the at least one local device comprises a microscopic camera device and a motorized stage; capturing, by the microscopic camera device, an image of the microslide according to the capture command of the control command, wherein the microslide is placed on the microscopic camera device of the at least one local device; transmitting, by the local device, the image to the remote host in a video format; moving the motorized stage to a next preset position according to the movement command of the control command to capture another image of the microslide; and repeating the steps of capturing the image by the microscopic camera device, transmitting the image to the remote host, and moving the motorized stage to the next preset position until the microslide is captured completely.

DESCRIPTION OF THE PREFERRED EMBODIMENTS

Clear and complete description will be made to the technical solutions in embodiments of the present invention in conjunction with drawings in the embodiments of the present invention hereafter. Obviously, the described embodiments are merely a part of embodiments of the present invention and not all the embodiments. Based on the embodiments of the invention, all other embodiments obtained by those skilled in the art without involving any inventive effort are within the scope of the invention.

It is understood that the terms "comprises" and "includes" when used in the specification and the appended claims indicates the presence of features, entities, steps, operations, elements, and/or components described while the presence or addition of one or more other features, entities, steps, operations, elements, components and/or combinations thereof are not excluded.

It is also understood that the terms used herein is for the purpose of describing particular embodiments and is not intended to be limiting the invention. As used in the specification and the appended claims, the singular forms of "a," "one" and "the" are intended to include the plural forms, unless the context clearly indicates otherwise.

It is further understood that the term "and/or" used in the specification and the appended claims refers to any combination of one or more of the associated listed items and all possible combinations, and includes such combinations.

Figure 1:
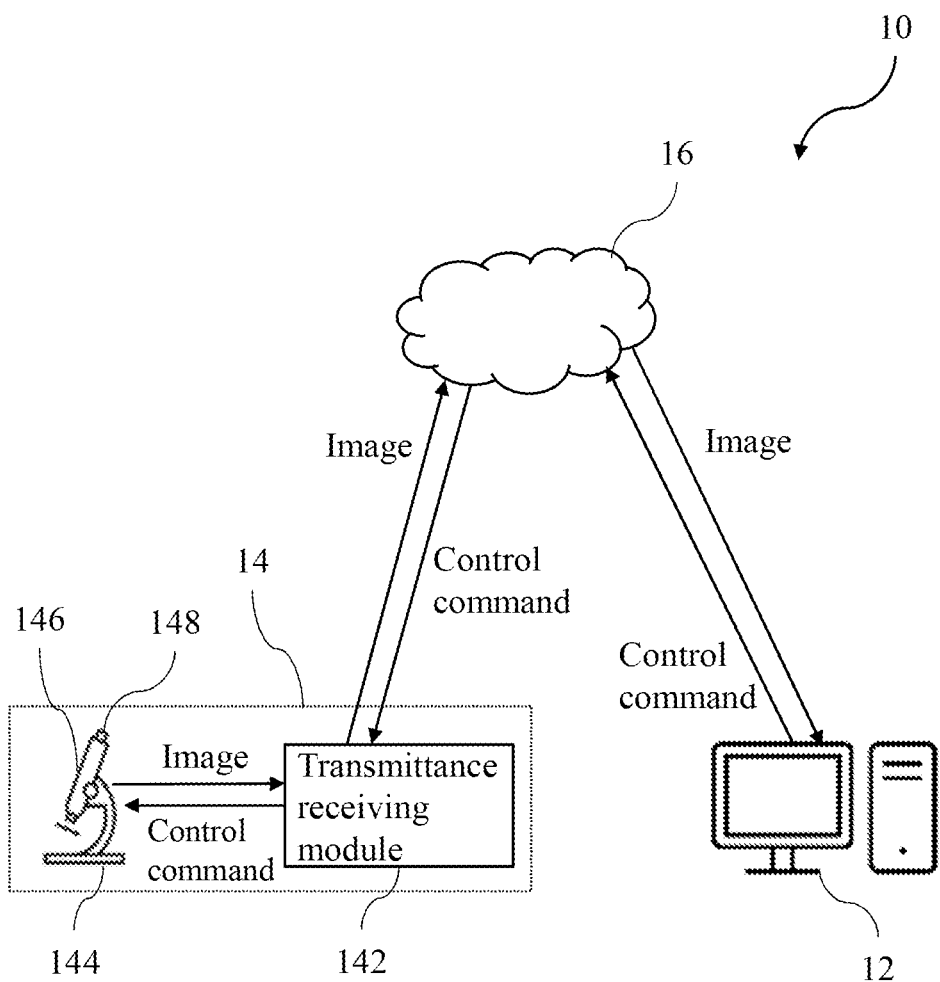
FIG. 1 is a structure diagram of a system for remotely controlling microscopic machinery according to the present invention.

The invention provides a system of remote control machinery and a method using the same. With reference to FIG. 1, a structure diagram of a system 10 of remote control microscopic machinery according to the invention is shown. The system of remote control machinery 10 according to the invention includes a remote host 12 and at least one local device 14. The remote host 12 is in signal communication with the local device 14 through Internet 16. The remote host 12 is a computer with computing processing capability, which, in addition to sending at least one control command to the local device 14 through the Internet 16 separately or simultaneously, may receive images transmitted by the local device 14, and perform operations such as image analysis processing on the images. The local device 14 may have a plurality of devices, which are controlled by the remote host 12 simultaneously.

Each of the at least one local device 14 respectively includes a transceiver module 142, a motorized stage 144 and a microscopic camera device, wherein the microscopic camera device is an electron microscope, and includes a microscope 146 and a camera 148, the camera 148 being mounted on a lens of the microscope 146. The transceiver module 142 is electrically connected with the motorized stage 144 and the microscopic camera device, especially the camera 148 in the microscopic camera device. The microscopic camera device 146 is mounted on the motorized stage 144, and a microslide (not shown in the figure) is placed on the microscope 146. The transceiver module 142 is used for receiving a control command sent by the remote host 12, and the control command includes a movement command and a capture command. The movement command is given to the motorized stage 144, and the capture command is given to the camera 148 in the microscopic camera device. The camera 148 captures the slide according to the capture command to generate one image. Each time a capture command is executed by the camera 148, a movement command is triggered to displace the motorized stage 144. In an embodiment of the invention, the transceiver module 142 may be disposed in a host (not shown in the figure) to transfer the control command to the motorized stage 144 or the camera 148 through the host; the transceiver module 142 may further be disposed in a chip (not shown in the figure), and the chip is disposed on the microscope 146 or the motorized stage 144 to transmit the control command to the motorized stage 144 or the camera 148 through the chip.

After the camera 148 captures the image of the microslide, a single image is directly transmitted back to the remote host 12 through the Internet 16, and each image is an undamaged high-quality image. In addition, after the camera 148 captures the image of the microslide, the image maybe directly transmitted in the video format back to the remote host 12 without compression. Therefore, since the image does not need to be compressed, there is no time delay caused by accumulating multiple images, compressing them and then sending them back to the remote host. On the screen of the remote host 12, the displayed image is the image just captured, rather than several previous images.

Figure 2:
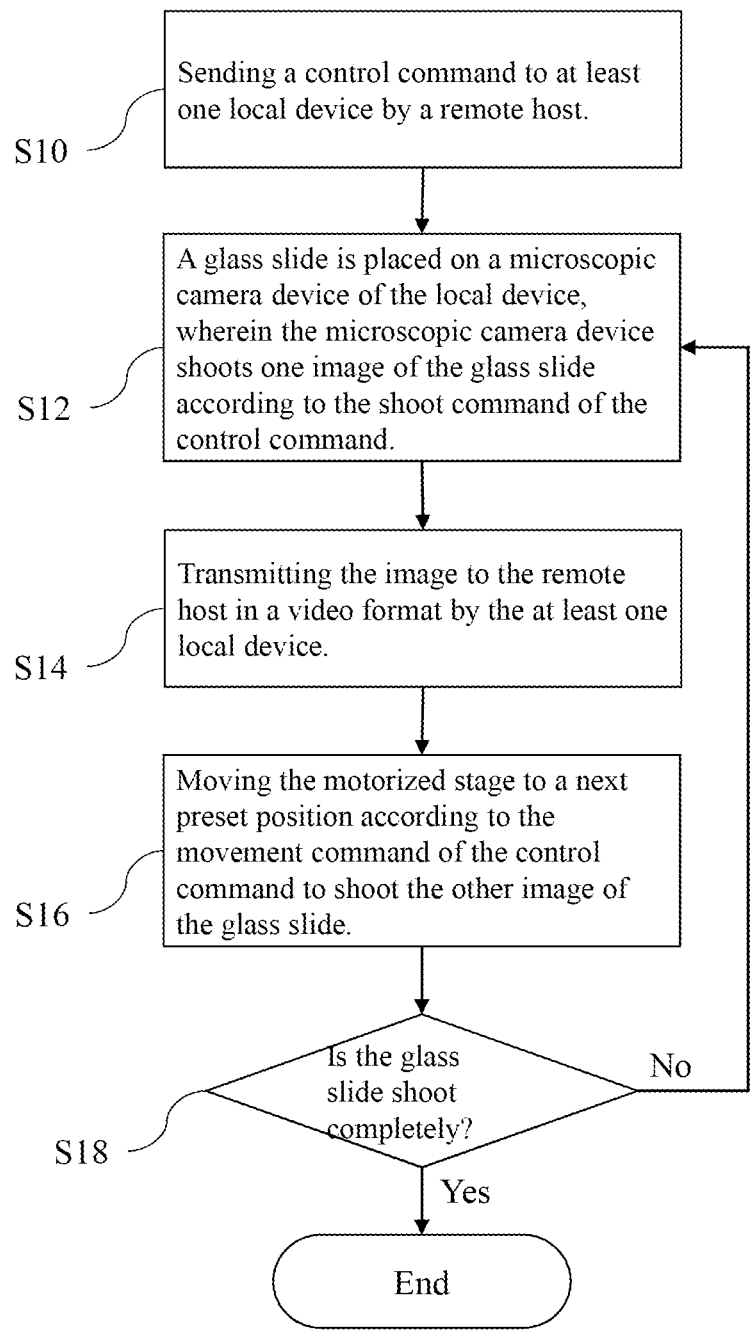
FIG. 2 is a flow chart of a method using for remotely controlling microscopic machinery according to the present invention.

Please also refer to FIG. 2 for the detailed operation of the above components, which is a flow chart of the method using the remote control microscopic machinery. In the step S10, at least one control command is sent by the remote host 12 to at least one local device 14. In the step S12, a microslide is placed on a microscopic camera device of the local device 14, wherein the camera 148 of the microscopic camera device captures one image of the microslide according to a capture command in the control command. Further, the microslide is divided into multiple blocks, which are captured separately, so multiple images will be captured for one piece of the microslide to complete the full image of the microslide. In the step S14, the local device 14 directly transmits the single image captured just now to the remote host 12 in a video format, rather than in the form of an image stream. In the step S16, the motorized stage 144 is moved to a next preset position according to a movement command in the control command to capture another image of the microslide. In the step S18, that the full image of the microslide is captured is determined, wherein if there are still blocks that have not been captured, the flow turns back to the step S12, and the steps of capturing the image by the microscopic camera device, transmitting the image to the remote host (step S14) and moving the motorized stage to the next preset position (step S16) are repeated until the microslide is captured, then the flow finishes.

In an embodiment of the invention, the motorized stage 144 is pre-stored with a movement track, wherein the movement track includes the movement command, and the move command is associated with the capture command and trigger each other. Therefore, after the camera 148 captures one image of the microslide according to the capture command, the movement command is automatically triggered, so that the motorized stage 144 moves to the next preset position according to the movement track; when the motorized stage 144 is positioned at the next position, the capture command is triggered again, so that the camera 148 captures the image of the microslide at the current position. Further, the movement track may also be sent by the remote host 12 to the local device 14, and the movement track may be included in the control command After the control command is received by the transceiver module 142, the movement track is stored in the motorized stage 144.

In the invention, it takes a certain amount time in mechanical movement for the motorized stage 144 to move from the first focus point to the second focus point. This time is very short, such as 1/10 of a second, which is approximately equal to the time required for a single image to be transmitted to the remote host 12. Therefore, the camera 148 captures one image and transmits the image to the remote host 12 immediately while the motorized stage 144 moving to the next pair of focal points, wherein the time of movement and the time for returning the image to the remote host offset each other, making up for the delay caused by returning the image, and solving the problem of asynchrony of image display easily caused by remote control. In addition, since the time in mechanical movement is short, there may be several focus points in one second, and the camera 148 may capture pictures continuously.

In summary, the system for remotely controlling microscopic machinery and the method thereof provided by the invention control the microscopic camera device at the local end by sending instructions from the remote end, and when the image is transmitted back to the remote host for display, a single image is directly transmitted back and the image is collected without a period of time. Moreover, the image does not need to be compressed, which may greatly reduce the time delay. Furthermore, after the microscopic camera device captures an image, the motorized stage automatically moves to the next position; this moving process may just offset the time for the image to be transmitted back to the remote host, and make up for the delay caused by the image return, thereby solving the problem of asynchronism between the image display and the picture taken easily caused by remote control.

The above mentioned is only the preferred embodiments of the present invention and is not intended to limit the scope of the implementation of the present invention. Therefore, any equivalent changes or modifications made according to the features and spirit described within the scope of the present invention should be included within the claims of the present invention.

What is claimed is:

1. A system for remotely controlling microscopic machinery, comprising:
    a remote host for sending a control command, wherein the control command comprises a movement command and a capture command; and
    at least one local device comprising:
    a transceiver module, receiving the control command sent by the remote host;
    a motorized stage, electrically connected with the transceiver module to move according to the movement command of the control command; and
    a microscopic camera device, disposed on the motorized stage and electrically connected with the transceiver module, wherein a microslide is placed on the microscopic camera device, and the microscopic camera device captures an image of the microslide according to the capture command of the control command;
    wherein after the microscopic camera device captures the image of the microslide according to the capture command, the transceiver module transmits the image to the remote host in a video format, and the motorized stage moves to a next preset position according to the movement command to capture another image of the microslide.

2. The system for remotely controlling microscopic machinery according to claim 1, wherein the microscopic camera device comprises a microscope and a camera, and the camera is mounted on a lens of the microscope.

3. The system for remotely controlling microscopic machinery according to claim 1, wherein the image is transmitted to the remote host without compression.

4. The system for remotely controlling microscopic machinery according to claim 1, wherein the at least one local device comprises a host, and the transceiver module is disposed in the host to transfer the control command to the microscopic camera device or the motorized stage through the host.

5. The system for remotely controlling microscopic machinery according to claim 1, wherein the at least one local device comprises a chip, the transceiver module is disposed in the chip, and the chip is disposed on the microscopic camera device or the motorized stage to transfer the control command to the microscopic camera device or the motorized stage through the chip.

6. The system for remotely controlling microscopic machinery according to claim 1, wherein the motorized stage is pre-stored with a movement track to automatically move to the next preset position after the microscopic camera device captures the image.

7. The system for remotely controlling microscopic machinery according to claim 1, wherein the control command transmitted by the remote host further comprises a movement track, and the movement track is stored in the motorized stage after being received by the transceiver module, so that the motorized stage automatically moves to the next preset position after the microscopic camera device captures the image.

8. A method for remotely controlling microscopic machinery, comprising steps of:
    sending, by a remote host, a control command to at least one local device, wherein the control command comprises a capture command and a movement command, and the at least one local device comprises a microscopic camera device and a motorized stage;
    capturing, by the microscopic camera device, an image of a microslide according to the capture command of the control command, wherein the microslide is placed on the microscopic camera device of the at least one local device;

transmitting, by the at least one local device, the image to the remote host in a video format; moving the motorized stage to a next preset position according to the movement command of the control command to capture another image of the microslide; and repeating the steps of capturing the image by the microscopic camera device, transmitting the image to the remote host, and moving the motorized stage to the next preset position until the microslide is captured completely.

9. The method for remotely controlling microscopic machinery according to claim 8, wherein the image is transmitted to the remote host without compression.

10. The method for remotely controlling microscopic machinery according to claim 8, wherein the at least one local device receives the control command and transmits the image by using a transceiver module.

11. The method for remotely controlling microscopic machinery according to claim 10, wherein the transceiver module is disposed in a host to transfer the control command to the microscopic camera device or the motorized stage through the host.

12. The method for remotely controlling microscopic machinery according to claim 10, wherein the transceiver module is disposed in a chip, and the chip is disposed on the microscopic camera device or the motorized stage to transfer the control command to the microscopic camera device or the motorized stage through the chip.

13. The method for remotely controlling microscopic machinery according to claim 8, wherein the motorized stage is pre-stored with a movement track to automatically move to the next preset position after the microscopic camera device captures one image.

14. The method for remotely controlling microscopic machinery according to claim 8, wherein the control command transmitted by the remote host further comprises a movement track, and the movement track is stored in the motorized stage after being received, so that the motorized stage automatically moves to the next preset position after the microscopic camera device captures one image.

\* \* \* \* \*